US006915689B2

(12) United States Patent
Edvardsson

(10) Patent No.: US 6,915,689 B2
(45) Date of Patent: Jul. 12, 2005

(54) APPARATUS AND METHOD FOR RADAR-BASED LEVEL GAUGING

(75) Inventor: Kurt O. Edvardsson, Täby (SE)

(73) Assignee: Saab Rosemount Tank Radar AB, Gothenburg (SE)

( * ) Notice: Subject to any disclaimer, the term of this patent is extended or adjusted under 35 U.S.C. 154(b) by 232 days.

(21) Appl. No.: 10/301,551

(22) Filed: Nov. 21, 2002

(65) Prior Publication Data

US 2004/0099058 A1 May 27, 2004

(51) Int. Cl.[7] .......................... G01F 23/28; G01R 27/04

(52) U.S. Cl. .................................... 73/290 V; 324/637

(58) Field of Search ....................... 73/290 V; 324/124, 324/637; 367/908

(56) References Cited

U.S. PATENT DOCUMENTS

| | | | | | |
|---|---|---|---|---|---|
| 3,812,422 | A | | 5/1974 | De Carolis | 324/58.5 |
| 4,847,623 | A | * | 7/1989 | Jean et al. | 342/124 |
| 4,954,997 | A | * | 9/1990 | Dieulesaint et al. | 367/13 |
| 5,070,730 | A | * | 12/1991 | Edvardsson | 73/290 V |
| 5,099,454 | A | * | 3/1992 | Dieulesaint et al. | 367/99 |
| 5,136,299 | A | | 8/1992 | Edvardsson | 342/124 |
| 5,233,352 | A | * | 8/1993 | Cournane | 342/124 |
| 5,365,178 | A | * | 11/1994 | Van Der Pol | 324/644 |
| 5,406,842 | A | * | 4/1995 | Locke | 73/290 R |
| 6,184,818 | B1 | | 2/2001 | Meinel | 342/124 |
| 2004/0108860 | A1 | * | 6/2004 | Spanke | 324/644 |

FOREIGN PATENT DOCUMENTS

| | | | | |
|---|---|---|---|---|
| DE | 4327333 A1 | * | 2/1995 | G01F/23/28 |

OTHER PUBLICATIONS

Lang, Hugo et al., "Smart Transmitter Using Microwave Pulses to Measure the Level of Liquids and Solids in Process Applications," Advances in Instrumentation and Control, Instrument Society of America, Research Triangle Park, US, vol. 48, No. 2, 1993, pp. 731–742.

Soulkov, A.S. et al., "Microwave Sensors for Technological Processes with Sedimentable Substances," IMTC 2000, Proceedings of the 17$^{th}$ IEEE Instrumentation and Measurement Technology Conference, Baltimore, MD, May 1–4, 2000, vol. 2 of 3, May 1, 2000, pp. 770–773.

* cited by examiner

*Primary Examiner*—Hezron Williams
*Assistant Examiner*—John Fitzgerald
(74) *Attorney, Agent, or Firm*—Westman, Champlin & Kelly, P.A.

(57) ABSTRACT

An apparatus for gauging the level of a liquid, above which a gas having a dielectric constant within a predetermined dielectric constant range exists, comprises a transmitter for transmitting a microwave signal in a propagation mode in a tube through the gas towards the liquid surface; a receiver for receiving the microwave signal reflected against the liquid surface and propagating back through the tube; and a processing device for calculating from the propagation time of the transmitted and reflected microwave signal the level of the liquid. In order to essentially avoid the influence on the calculated level by the dielectric constant of the gas above the liquid, the transmitter is adapted to transmit the microwave signal in a frequency band, at which the group velocity of the microwave signal in the propagation mode in the tube is, within the predetermined dielectric constant range, essentially independent of the dielectric constant.

71 Claims, 9 Drawing Sheets

APPARATUS AND METHOD FOR RADAR-BASED LEVEL GAUGING

FIELD OF THE INVENTION

The invention relates generally to radar-based level gauging, and more specifically the invention relates to apparatuses and methods for radar-based level gauging of the level of a liquid through a waveguide at high accuracy without prior knowledge of the exact gas composition and/or pressure above the surface of the liquid.

BACKGROUND OF THE INVENTION AND RELATED ART

A device for gauging the level of a liquid in a container comprises a transmitter for transmitting a microwave signal towards the surface of the liquid, a receiver for receiving the microwave signal reflected against the surface of the liquid, and a signal processing device for calculating the level of the liquid in the container from the propagation time of the transmitted and reflected microwave signal.

Such device has become more and more important, particularly for petroleum products such as crude oil and products manufactured from it. By containers is here meant large containers constituting parts of the total loading volume of a tanker, or even larger usually circular-cylindrical land-based tanks with volumes of tens or thousands of cubic meters.

In one particular kind of radar-based device for gauging the level of a liquid in a container the microwave signal is transmitted, reflected and received through a vertical steel tube mounted within the container, which acts as a waveguide for the microwaves. An example of such tube-based level gauge is disclosed in U.S. Pat. No. 5,136,299 to Edvardsson. The velocity of microwaves in a waveguide is lower than that for free wave propagation, but in the calculation of the level of the liquid in the container from the propagation time, this may be taken into account either by means of calculations based on knowledge of the dimensions of the waveguide or by means of calibration procedures.

Further, the gas above the surface of the liquid reduces the velocity of the microwaves. This velocity reduction may be accurately estimated, but only if the gas composition, temperature and pressure are known, which hardly is the case.

SUMMARY OF THE INVENTION

When ordinary petroleum products are used, i.e. such that are fluent at usual temperatures, the gas in the tube is typically air. The nominal dielectric constant in air is 1.0006 with a typical variation of ±0.0001. The tank content would, however, increase the dielectric constant over that of air in case of evaporation of hydrocarbons etc. Such increase may be notable.

Further, when to gauge the level in a container that contains a liquefied gas under overpressure the change in velocity is highly notable. Among the common gases propane has the highest dielectric constant causing about 1% velocity decrease at a pressure of 10 bar (corresponding to $\epsilon$=1.02). Such large discrepancy is in many applications, such as in custody transfer applications, not acceptable.

A higher accuracy, defined as custody transfer accuracy, is thus often needed. By the expression custody transfer accuracy is herein meant an accuracy sufficient for a possible approval for custody transfer, which is a formal requirement in many commercial uses of level gauging. In terms of propagation velocity custody transfer accuracy may imply an accuracy in determination of the level in the range of about 0.005–0.05%.

However, the requirements for custody transfer vary quite much from country to country and from organization to organizations, but obviously the example as identified above does not comply with any custody transfer accuracy.

A main object of the invention is thus to provide a radar-based apparatus and a method for gauging the level of a liquid through a tube at higher accuracy without prior knowledge of the exact gas composition and/or pressure above the surface of the liquid.

A particular object of the invention to provide such an apparatus and such a method, which provide for an accuracy of the gauged level, which is better than 0.4%, preferably better than 0.1%, and most preferably better than 0.01% for a gas or gas mixture above the surface of the liquid, which has a dielectric constant anywhere in the interval $1 \leqq \epsilon \leqq 1.03$. This interval is chosen to include propane, butane, methane and other common gases with a certain margin.

In this respect there is a particular object of the invention to provide such an apparatus and such a method, which are capable of gauging the level of a liquid with a custody transfer accuracy.

A further object of the invention is to provide such an apparatus and such a method for gauging the level of a liquid through a tube, which also provide for accurate measurement of the inner dimension of the tube.

A yet further object of the invention is to provide such an apparatus and such a method for gauging the level of a liquid through a tube, which provide for reduction of the error by estimating one or more properties of the tube or of the environment in the container, e.g. a cross-sectional dimension of the tube, a variation in a cross-sectional dimension along the length of the tube, a concentricity measure of the tube, presence of impurities, particularly solid or liquid hydrocarbons, at the inner walls of the tube, or presence of mist, particularly oil mist, in the gas.

These objects, among others, are attained by apparatuses and methods as claimed in the appended claims.

Radar level gauges use a rather wide bandwidth (the width may be 10–15% of the center frequency) and the propagation is characterized by the group velocity in the middle of that band. The inventor has found that by appropriate selections of the frequency band and mode propagation of the transmitted and received microwave signal, and of the inner dimension of the tube, it is possible to obtain a group velocity of the microwave signal, which is fairly constant over an interesting range of dielectric constant values, preferably between 1 and 1.03. An analysis shows that the group velocity may vary as little as ±0.005% over the interval 1–1.03 for the dielectric constant, whereas a variation of ±0.75% would have been obtained using a conventional apparatus, for instance using free space propagation.

The center frequency of the frequency band of the microwave signal is preferably about $(2/\epsilon)^{1/2}$ times the cut-off frequency in vacuum for the mode and inner tube dimension selected, or close thereto, where $\epsilon$ is the center dielectric constant of the interesting range of dielectric constant values, e.g. 1.015 in the preferred range as identified above. Thus, the optimal center frequency will be about $2^{1/2}$ times the actual cut-off frequency for a gas having a dielectric constant in the middle of the interesting range of dielectric constant values.

The present invention may be specified quantitatively as that the microwave signal is transmitted in a frequency band, which includes a frequency deviating from an optimum frequency $f_{opt}$ with less than 7%, preferably less than 5%, more preferably with less than 3%, still more preferably with less than 2%, and yet more preferably with less than 1%, wherein the optimum frequency is calculated as $$f_{opt} = f_{c0}\sqrt{\frac{2}{\varepsilon}}$$

where $f_{c0}$ is the cut-off frequency of the propagation mode in the tube, and $\epsilon$ is the center dielectric constant of the dielectric constant range of interest. These frequencies are higher than those employed when single mode propagation has to be guaranteed, but much lower than those typically employed when an over-dimensioned tube and mode suppression are applied as described in U.S. Pat. No. 4,641,139 and U.S. Pat. No. 5,136,299 both to Edvardsson. Thus the frequency used in this invention is at least partly outside of the frequency range used in prior art concerning both tubes and level gauging.

Most advantageously, however, the frequency band has a center frequency which is the optimum frequency $f_{opt}$ or deviates from the optimum frequency $f_{opt}$ with less than 1–7%.

Preferably, a circular tube and the mode $H_{11}$ are used for gauging. Selection of a frequency of about $(2/\epsilon)^{1/2}$ times the cut-off frequency for the mode $H_{11}$ in vacuum, will also allow the microwave signal to propagate in the $E_{01}$ mode. The microwave signal may be measured in these two modes separately of each other, and the measurement of the $E_{01}$ mode microwave signal may be used to deduce information regarding the dimension of the tube and/or information regarding the dielectric property of the gas or gas mixture above the surface of the liquefied gas.

More generally, a microwave signal may be measured in at least two different modes separately of each other. Such dual mode measurement may be used to deduce information regarding a condition of the tube, e.g. tube dimension, presence of oil layers on inner tube walls, or atmospheric conditions in the tube, e.g. presence of mist, and to use this information to reduce any error introduced by that condition in the gauged level.

A main advantage of the present invention is that level gauging through a tube with high accuracy may be performed without any prior knowledge of the composition and pressure of the gas present above the surface, which is gauged.

Another advantage of the present invention is that errors introduced by conditions of the tube may be reduced by means of dual mode measurements.

Still another advantage of the invention is that by selecting a frequency close to the optimum frequency as defined above for the dielectric constant range of 1–1.03 influences from e.g. a variable amount of hydrocarbon droplets within the tube and thin hydrocarbon layers of variable thickness on the inner walls of the tube are minimized.

Further characteristics of the invention, and advantages thereof, will be evident from the detailed description of preferred embodiments of the present invention given hereinafter and the accompanying FIGS. 1–12, which are given by way of illustration only, and thus are not limitative of the present invention.

In this description, the waveguide designations $H_{11}$, $E_{01}$, $H_{01}$ etc. will be used as being a parallel and fully equivalent system to the designations $TE_{11}$, $TM_{01}$, $TE_{01}$ etc.

BRIEF DESCRIPTION OF THE DRAWINGS

FIG. 3 is a schematic diagram of group velocity as a function of dielectric constant for the $H_{11}$ mode of microwave radiation in a waveguide at three different frequencies illustrating the principles of the present invention: one optimum frequency, one frequency substantially lower than that, and one frequency substantially higher than that.

DESCRIPTION OF PREFERRED EMBODIMENTS

Figure 1:
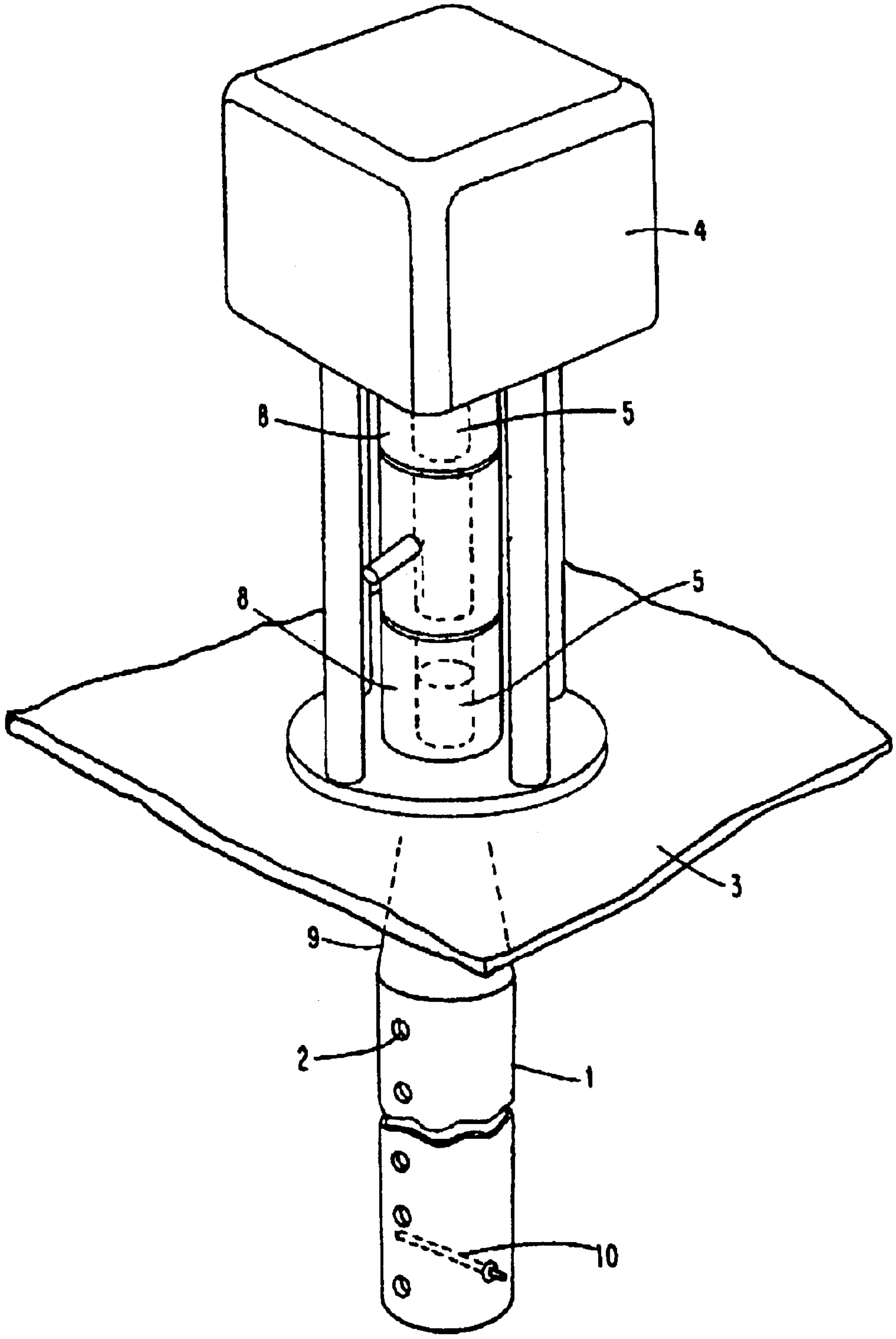
FIG. 1 illustrates schematically, in a perspective view, a device for radar-based level gauging according to a preferred embodiment of the present invention

With reference to FIG. 1, which schematically illustrates, in a perspective view, an apparatus aimed for radar-based level gauging, a preferred embodiment of the present invention will be described. The apparatus may be a frequency modulated continuous wave (FMCW) radar apparatus or a pulsed radar apparatus or any other type of distance measuring radar, but is preferably the former. The radar apparatus may have a capability of transmitting a microwave signal at a variable frequency, which is adjustable.

In the Figure, 1 designates a substantially vertical tube or tube that is rigidly mounted in a container, the upper limitation or roof of which is designated by 3. The container contains a liquid, which may be a petroleum product, such as crude oil or a product manufactured from it, or a condensed gas, which is stored in the container at overpressure and/or cooled. Propane and butane are two typical gases stored as liquids.

The tube 1 is preferably of a metallic material to be capable of acting as a waveguide for microwaves and may have an arbitrary cross-sectional shape. However, a circular, rectangular, or super-elliptical cross-section is preferred. The tube is not shown in its entire length but only in its upper and lower portions. The tube is provided with a number of relatively small openings 2 in its wall, which makes possible the communication of the fluid from the container to the interior of the tube, so that the level of the liquid is the same in the tube as in the container. It has been shown to be possible to choose size and locations of the holes so that they do not disturb the wave propagation but still allow the interior and exterior liquid level to equalize sufficiently fast.

A unit 4 is rigidly mounted thereon. This unit 4 comprises a transmitter, not explicitly shown, for feeding a microwave signal, a receiver for receiving the reflected microwave signal, and a signal processing device for determining the reflect position of the reflected microwave signal.

The transmitter comprises a waveguide, designated by 5 in FIG. 1, which is surrounded by a protection tube 8. The waveguide 5 passes via a conical middle piece 9 over to the tube 1.

In operation the transmitter generates a microwave signal, which is fed through the waveguide 5 and the conical middle piece 9, and into the tube 1. The microwave signal propagates in the tube 1 towards the surface to be gauged, is reflected by the surface and propagates back towards the receiver. The reflected signal passes through the conical middle piece 9 and the waveguide 5, and is received by the receiver. The signal processing device calculates the level of the liquid from the round-trip time of the microwave signal.

According to the present invention transmitter is adapted to transmit the microwave signal in a frequency band, which includes a frequency deviating from an optimum frequency $f_{opt}$ with less than 7%, wherein the optimum frequency is calculated as $$f_{opt} = f_{c0}\sqrt{\frac{2}{\varepsilon}}$$

where $f_{cC}$ is the cut-off frequency of the propagation mode in the tube 1 in vacuum, and $\epsilon$ is the center dielectric constant of a dielectric constant range of interest, preferably, but not exclusively, set to 1–1.03, or to a sub-range thereof.

By such selection of frequency the variation of the group velocity of the microwaves when the dielectric constant of the gas in the tube 1 above the surface of the liquid varies from 1 to 1.03 is extremely small, and accurate measurements of the level of the liquid may be performed without knowledge of the composition and pressure of the gas above the liquid surface.

Preferably, the frequency deviates from the optimum frequency $f_{opt}$ with less than 5%, more preferably with less than 3%, still more preferably with less than 2%, yet more preferably with less than 1%, and still more preferably the frequency is identical with the optimum frequency $f_{opt}$. Optionally the frequency band has a center frequency, which deviates from the optimum frequency $f_{opt}$ with less than 7%, 5%, 3%, 2% or 1%.

These figures will give slightly larger velocity variations than what is obtained using the optimum frequency, but still the variations are much smaller than what would have been obtained using frequencies employed in prior art devices.

A description of the theory behind the invention and a derivation of the optimum frequency as identified above are given.

The propagation in any homogenous hollow waveguide (i.e. filled by a single material having the dielectric constant $\epsilon$) can be described by the variation of phase constant $\beta$ giving the phase change in radians per meter:

$$\beta=\sqrt{k^2\epsilon-k_{c0}^2} \quad \text{(Eq. 1)}$$

where k is the wave number ($k=2\pi f/c$ where f is the frequency and c the velocity of light in vacuum) and $k_{c0}$ the cut-off wave number in vacuum ($k=2\pi f_{c0}/c$ where $f_{c0}$ is the cut-off frequency in vacuum), which is the lower limit for propagation in the waveguide. The formula above is valid for any single propagation mode regardless of the cross section of the waveguide.

The cut-off wave number $k_{c0}$ is related to the geometry of the waveguide cross section. For a circular cross section having radius a we have $$k_{c0}=X/a \quad \text{(Eq. 2)}$$

where X is an applicable root for the Bessel-function ($J_0(x)$, $J_1(x)$ etc.) and the 0 in $k_{c0}$ is inserted to stress that $k_{c0}$ applies to vacuum. The few lowest modes in circular waveguides (diameter D=2a) are listed in Table 1 below.

As a comparison the cut-off wave numbers in a rectangular waveguide having a cross-sectional size of a times b, where a>b) can be written:

$$k_{c0n,m} = \pi\sqrt{\frac{n^2}{a^2}+\frac{m^2}{b^2}} \quad \text{(Eq. 3)}$$

where n and m are non-negative integers with the alternative constraints nm>0 (E-modes) or n+m>0 (H-modes).

Returning now to the propagation constant $\beta$ it is to be noted that it is at least slightly non-linear frequency dependent as compared to the propagation constant for a free propagating wave. Conventionally the propagation of a band-limited signal is described as a group velocity $v_g$, which is calculated as:

$$\frac{c}{v_g} = \frac{\partial\beta}{\partial k} = \frac{k\varepsilon}{\sqrt{k^2\varepsilon - k_{c0}^2}} \quad \text{(Eq. 4)}$$

where c is the velocity of light in vacuum (299792458 m/s) and the quotient $c/v_g$ is at least slightly larger than 1. For a waveguide having very large cross-sectional area (approaching the free space case) $k_{c0}$ may be neglected and then the quotient is simply the square root of the dielectric constant $\epsilon$.

TABLE 1

Modes in circular waveguides. Common notation, X, $\lambda_{c0}/D$, where $\lambda_{c0}$ is the cut-off wavelength in vacuum and D is the diameter, D = 2a, are given for each mode of propagation.

| Notation | $X_{nm}$ | $\lambda_{c0}/D$ | Remark |
|---|---|---|---|
| $H_{11}$ or $TE_{11}$ | 1.841 (1st max of $J_1$) | 1.706 | Lowest mode |
| $E_{01}$ or $TM_{01}$ | 2.405 (1st zero of $J_0$) | 1.306 | |
| $H_{21}$ or $TE_{21}$ | 3.054 (1st max of $J_2$) | 1.029 | |
| $H_{01}$ or $TE_{01}$ | 3.832 (1st non-zero max of $\lvert J_0\rvert$) | 0.820 | Low loss mode |
| $E_{11}$ or $TM_{11}$ | 3.832 (2nd zero of $J_1$) | 0.820 | Same X as $H_{01}$ |
| $H_{31}$ or $TE_{31}$ | 4.201 (1st max of $J_3$) | 0.748 | |

A closer examination of Eq. 4 reveals that it always has a minimum when the dielectric constant $\epsilon$ is allowed to vary over all positive values. This can easily be seen by noting that if $\epsilon$ is slightly above the value making the denominator zero $c/v_g$ will be a very large value and obviously the case is the same for very large $\epsilon$. This minimum may appear where $\epsilon$ has a physically unrealistic values but for any waveguide diameter 2a, a frequency (or wave number k) can be advised where this minimum occurs for a possible value of $\epsilon$ (since $k_{c0}$ is related to the diameter 2*a* according Eq. 2).

This minimum may appear where $\epsilon$ has physically unrealistic values but for any tube diameter 2a a frequency (or wave number k) can be advised where this minimum occurs for a possible value of $\epsilon$. To find the minimum of $c/v_g$ a second derivative is formed according:

$$\frac{\partial^2 \beta}{\partial \varepsilon \partial k} = \frac{k(0.5k^2\varepsilon - k_{c0}^2)}{(k^2\varepsilon - k_{c0}^2)^{1.5}} \quad \text{(Eq. 5)}$$

The minimum of $c/v_g$ is obtained where this derivative is zero. The wave number, denoted optimum wave-number $k_{opt}$, which satisfy such condition is thus:

$$k_{opt} = k_{c0}\sqrt{\frac{2}{\varepsilon}} \quad \text{(Eq. 6)}$$

By this choice small variations of $\epsilon$ (around the middle of the assumed $\epsilon$-interval, which can be 1–1.03) can be expected to give very small variations of vg, which the numerical evaluation below will quantify. The phenomenon can be described as a combination of two factors contributing to $v_g$: an increase of $\epsilon$ reduces the velocity of the microwaves, but it also makes the waveguide to appear bigger, which in turn increases the velocity of the waveguide propagation. The expression for the derivative indicates that these two counteracting effects can be made to cancel each other.

To illustrate the behavior a case with a waveguide having a diameter 2a=100 mm and an interval of $\epsilon$ ranging from 1 to 1.03, in which small variations of $v_g$ should be obtained, is given (i.e. an optimum wave number $k_{opt}$ is to be found for $\epsilon$=1.015). If the lowest mode of propagation, $H_{11}$, is used an optimum wave number $k_{opt}$ of 51.5 $m^{-1}$ is obtained using Eqs. 2 and 6. This optimum wave number corresponds to an optimum frequency $f_{opt}$ of 2.46 GHz.

Figure 2:
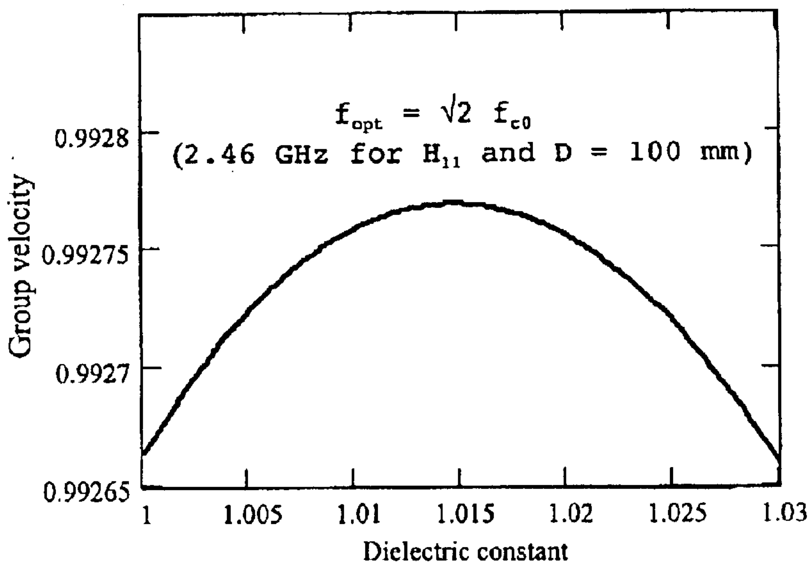
FIG. 2 is a schematic diagram of group velocity as a function of dielectric constant for the $H_{11}$, mode of microwave radiation in a waveguide at an optimum frequency.

FIG. 2 shows a diagram of group velocity normalized with respect to the velocity of light in vacuum as a function of dielectric constant for the $H_{11}$ mode of microwave radiation in a 100 mm waveguide at the optimum frequency, i.e. 2.46 GHz.

The velocity changes are within ±0.005% when the dielectric constant $\epsilon$ varies over 1–1.03 (±1.5%) or including air ($\epsilon$=1.0006) to propane ($\epsilon$=1.03). The improvement in velocity variation is 150 times and even more if the interval of dielectric constant values is limited to a smaller interval than 1–1.03.

Figure 3:
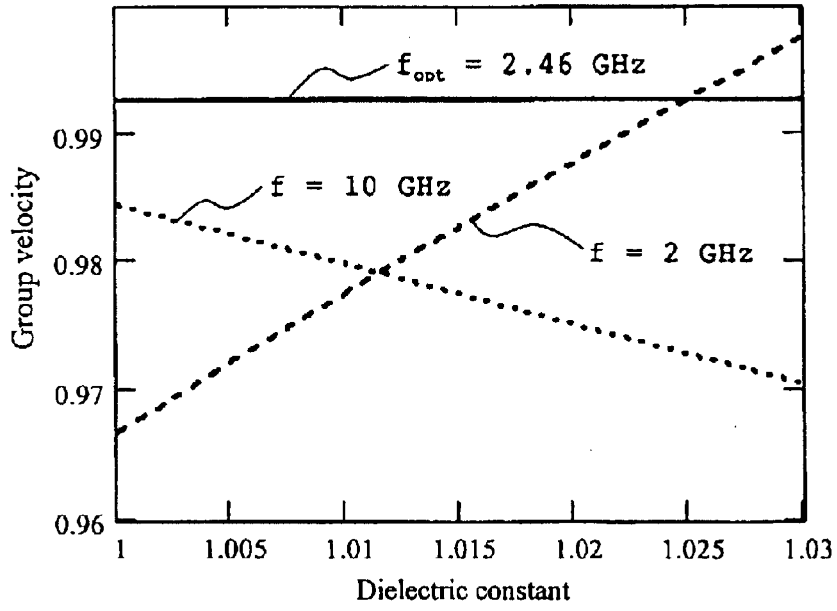
Figure 4:
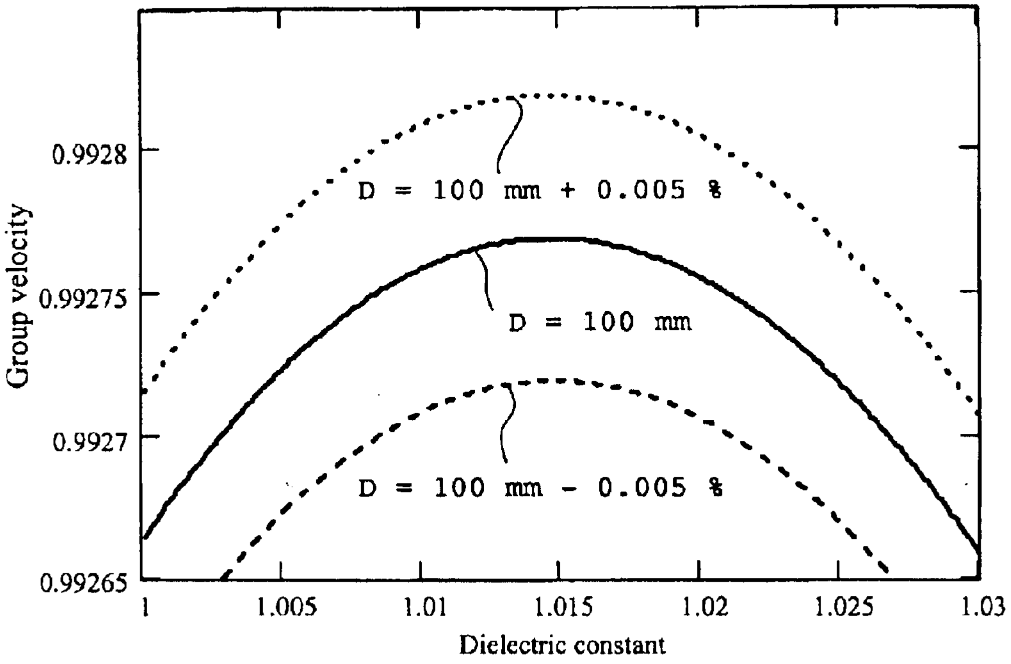
FIG. 4 is a schematic diagram of group velocity as a function of dielectric constant for the $H_{11}$, mode of microwave radiation in a waveguide at the optimum frequency for different waveguide diameters.

FIG. 3 shows a diagram of group velocity normalized with respect to the velocity of light in vacuum as a function of dielectric constant for the $H_{11}$ mode of microwave radiation in a 100 mm waveguide at 2.46 GHz, 10 GHz, and 2 GHz for comparison. Note that the vertical scale is enlarged 200 times with respect to FIG. 2. The curve for the optimum frequency appears as a horizontal straight line, i.e. no $\epsilon$-dependence on the group velocity, whereas the group velocities at 2 and 10 GHz, respectively, depend heavily on $\epsilon$ in the interval illustrated.

FIG. 3 illustrates the influence of the diameter of the waveguide on the group velocity obtained. The diagram shows group velocity normalized with respect to the velocity of light in vacuum as a function of dielectric constant for the $H_{11}$ mode of microwave radiation in waveguides of a diameter of 100 mm, of a diameter being 0.005% larger, and of a diameter being 0.005% smaller.

The position of the maximum of the group velocity is not changed remarkably when the diameter is slightly different.

However, the group velocity is heavily dependent on the diameter, and thus the diameter of the waveguide has to be very carefully measured or calibrated. More about this will be described below. First, however, a further illustration of the inventive concept is found in FIGS. 5–6.

Figure 5:
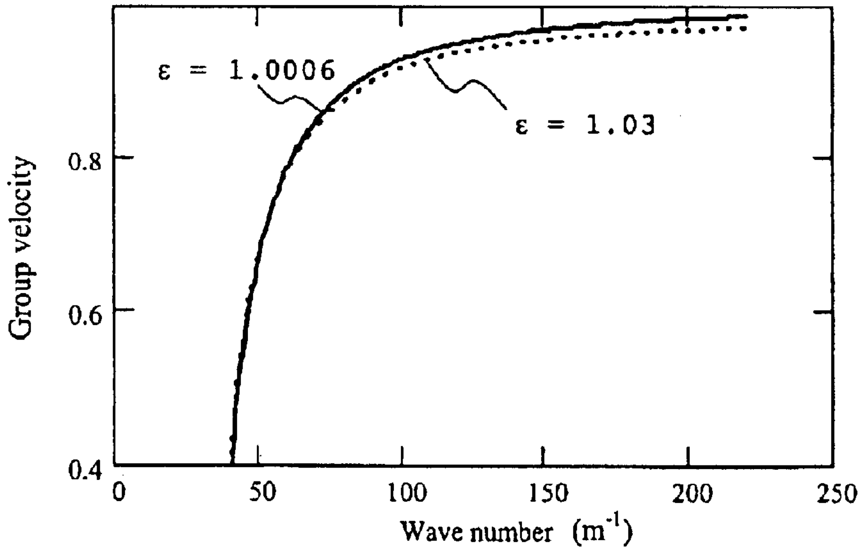
FIG. 5 is a schematic diagram of group velocity as a function of wave number for the $H_{11}$ mode of microwave radiation in a waveguide filled with gases having different dielectric constants.

FIG. 5 illustrates group velocity normalized with respect to the velocity of light in vacuum as a function of the wave number for the $H_{11}$ mode in a 100 mm waveguide for different values of the dielectric constant $\epsilon$, namely for $\epsilon$=1.0006 (air) and $\epsilon$=1.03 (1.02 corresponds to propane at 10 atm pressure, which is supposed to be worst case). It is noted that the two curves are intersecting at a particular wave number, which actually is the optimum wave number $k_{opt}$.

Figure 6:
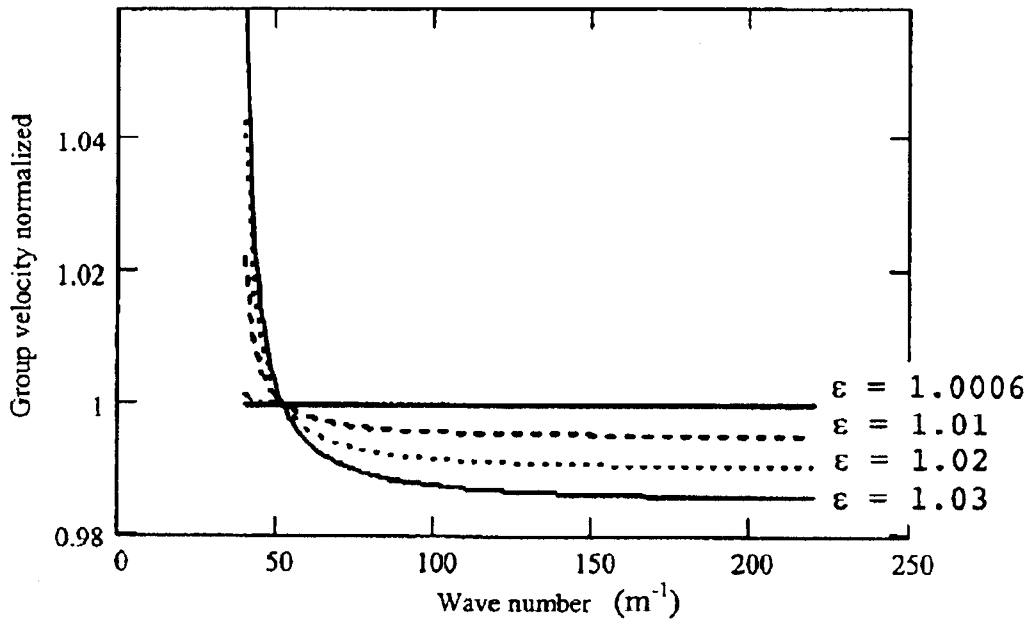
FIG. 6 is a schematic diagram of group velocity normalized to group velocity in vacuum as a function of wave number for the $H_{11}$ mode of microwave radiation in a waveguide filled with gases having different dielectric constants.

In FIG. 6, which shows a diagram of group velocity normalized with respect to the group velocity in vacuum as a function of the wave number for the $H_{11}$ mode in a 100 mm waveguide for different values of the dielectric constant $\epsilon$, this is clearly indicated. The velocity is shown for the following $\epsilon$: 1.03, 1.02, 1.01 and 1.0006. The intersection point is found at k=51.5 $m^{-1}$, which is the optimum wave number as indicated above.

A number of methods for calibrating or measuring the diameter of the waveguide, which has to be more carefully performed than when using an over-dimensioned waveguide and mode suppression as disclosed in U.S. Pat. No. 4,641,139 to Edvardsson, are available.

One method is to determine an effective diameter for one or several levels by means of in-situ calibration towards one or several known heights. In FIG. 1 a relatively thin metal pin 10 is mounted in the lower portion of the tube 1 diametrically perpendicular to the longitudinal direction thereof. This metal pin 10 consists of a reactance, which gives rise to a defined reflection of an emitted microwave signal, which is received by the receiver in the unit 4 and via the electronic unit gives a calibration of the gauging function. Such in-situ calibration is further discussed in U.S. Pat. No. 5,136,299 to Edvardsson, the content of which being hereby incorporated by reference. Of course the same calibration can in many times preferably be done using an accurate measurement towards a real liquid surface.

Another method is, by means of a feeding device, to transmit the microwave signal also in a second mode of propagation in the tube 1 through the gas towards the surface of the liquid, to receive the microwave signal reflected against the surface of the liquid and propagating back through the tube in the second mode of propagation, and to distinguish portions of the microwave signal received in different ones of the first and second modes of propagation.

Figure 7A:
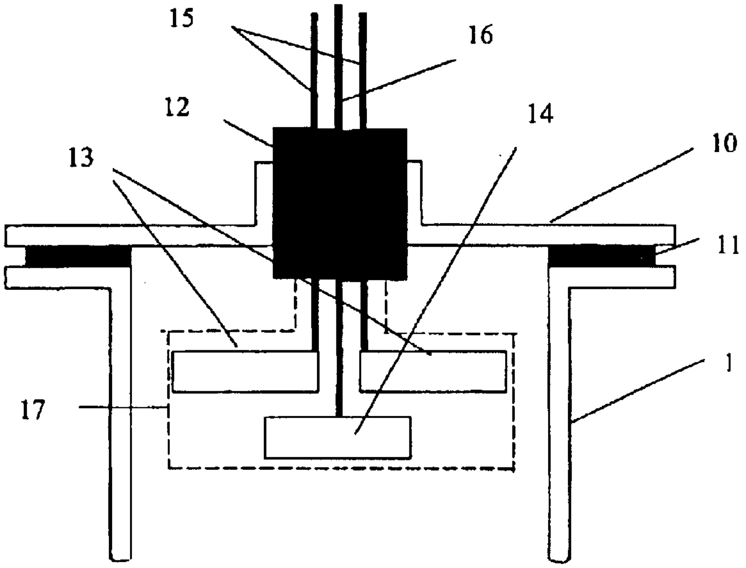
FIGS. 7*a–b* illustrates schematically in a cross-sectional side view and a bottom view, respectively, a device for waveguide feeding of the modes $H_{11}$ or $E_{01}$ separately, or both of them using separate feeding points.
Figure 7B:
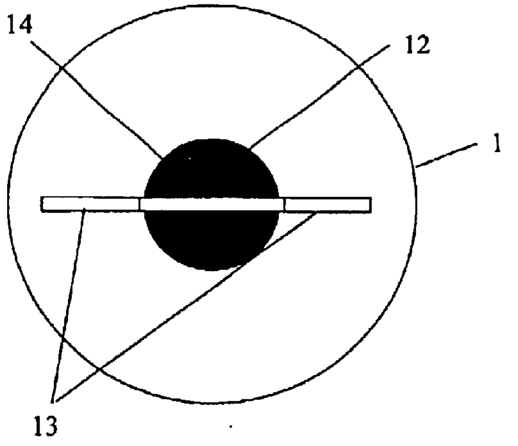

FIGS. 7*a*–*b* show one example of a waveguide feeding for two modes. The tube 1 is closed by a cover 10, which is sealed by sealings 11 and 12. Below the sealings a $\lambda/2$-dipole 13 is feeding the $H_{11}$-mode in the tube 1, which in turn is fed via two wires 15. Below the dipole 13, a member 14 is symmetrically mounted, which is given a shape suitable to feed the tube 1 with the $E_{01}$ mode. The member 14 is in turn fed by line 16. The lines 15, 16 pass a pressure sealing 12 and is connected to circuitry and cables (not shown) of the gauging apparatus. The two lines 15 are fed to a balun so they are fed in opposite phase and thus there will automatically be an insulation between the lines 15 and the single line 16 which is fed like a coaxial line with a portion of the cover 10 as the other part. With suitable shaping for matching etc. it is obvious that basically the same outline will work for both the two modes ($H_{11}$ and $E_{01}$) as well as for any one of this two modes. The antennas and feedings 13–16 can be made on a printed circuit board indicated by the dotted line 17.

Thus, two independent measurements may be performed and not only the level but also the diameter of the tube 1, e.g. an effective or average diameter, may be deduced from the measurements, see Eq. 4. One way to accomplish this is to use a waveguide connection giving two modes and utilize the fact that if the modes are very different the group velocity for the two modes may be sufficiently different to separate the echoes in time for a pulsed system or in frequency for a FMCW system.

The receiver of the unit 4 of FIG. 1 may be adapted to distinguish portions of the microwave signal received in different ones of the first and second modes of propagation based on the portions different arrival times at the receiver. The waveguide feeding then has two (or more) connections made to couple to different modes and either a RF-switch is connecting the modes sequentially or parts of the receiver or transmitter chain are doubled to allow measurement of the two (or more) modes.

The microwave signal portions may have very different propagation time to allow for sequential detection. Otherwise, the transmitter of the unit 4 may be adapted to transmit the microwave signal in the first and second modes of propagation sequentially.

Alternatively, the transmitter of the unit 4 is adapted to transmit the microwave signal in the first and second modes of propagation spectrally separated. Thus the waveguide feeding has different function for different frequencies giving one mode in one frequency interval and another in another frequency interval.

The signal processing device may alternatively (if the diameter is known) be adapted to calculate the dielectric constant of the gas above the level of the liquid based on the received and distinguished portions of the microwave signal received in different ones of the first and second modes of propagation.

Figure 8A:
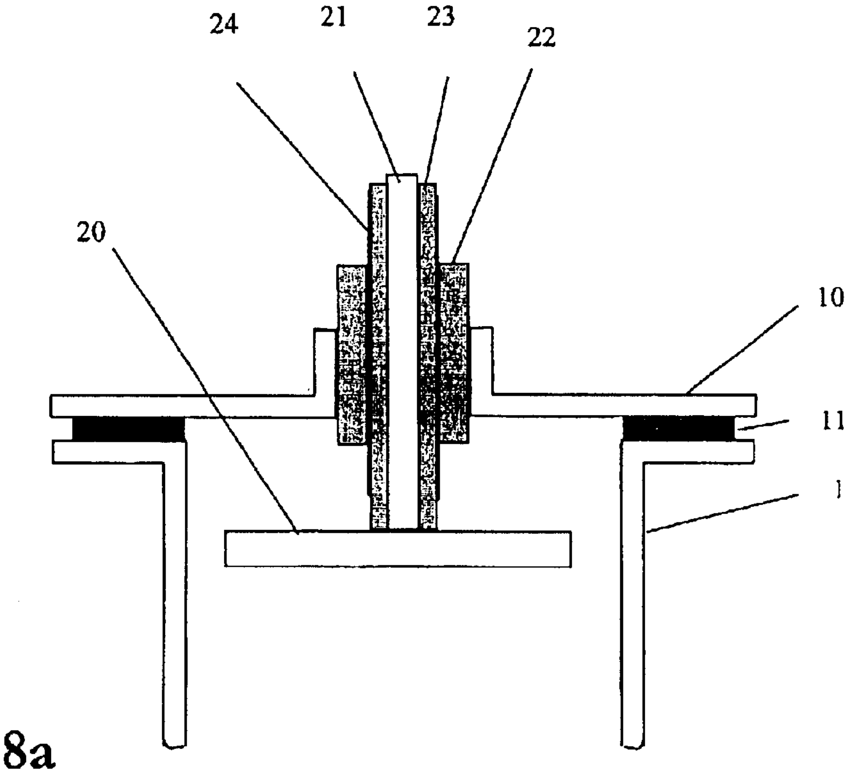
FIG. 8*a* illustrates schematically in a cross-sectional side view a device for waveguide feeding of the modes $H_{01}$ and $E_{01}$ with separate feeding points.
Figure 8B:
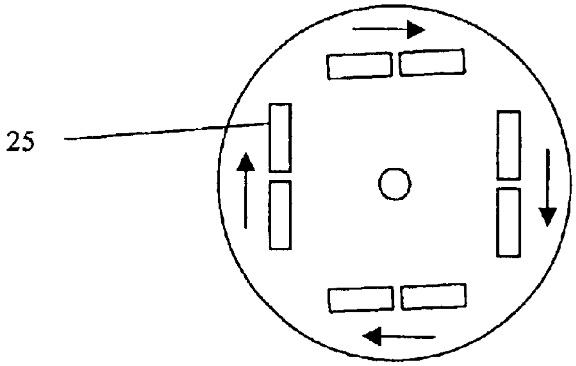
FIG. 8*b* illustrates schematically an antenna device as being comprised in the device of FIG. 8*a*.

FIGS. 8*a–b* show another waveguide feeding, which is suitable for feeding a microwave signal in the modes $H_{01}$ and $E_{01}$. The tube 1, cover 10 and sealing 11 are similar to the FIG. 8 embodiment. An antenna device, typically formed by a printed circuit board 20 is the crucial part of the feeding. The printed circuit board is fed by a coaxial line, the outside of which being shown at 21. The printed circuit board 20 carries four λ/2-dipoles 25, which are fed in phase (efficiently coupled in parallel by radial wires which are not shown) giving electrical field directions as indicated by the arrows and thus the dipoles can be made to couple efficiently to the $H_{01}$ waveguide propagation mode. The distance from the printed circuit board 20 to the cover 10 is about λ/4. The outside of the feeding coaxial line 21 is also the inside of another coaxial line with insulation 23 and shield 24. This coaxial line is feeding the $E_{01}$ mode generated by the member 24 and portions of the pattern on the printed circuit board 20. Insulation 23, 22 is the pressure sealing. The mechanical attachments of 22 and 23 are not shown.

Figure 9A:
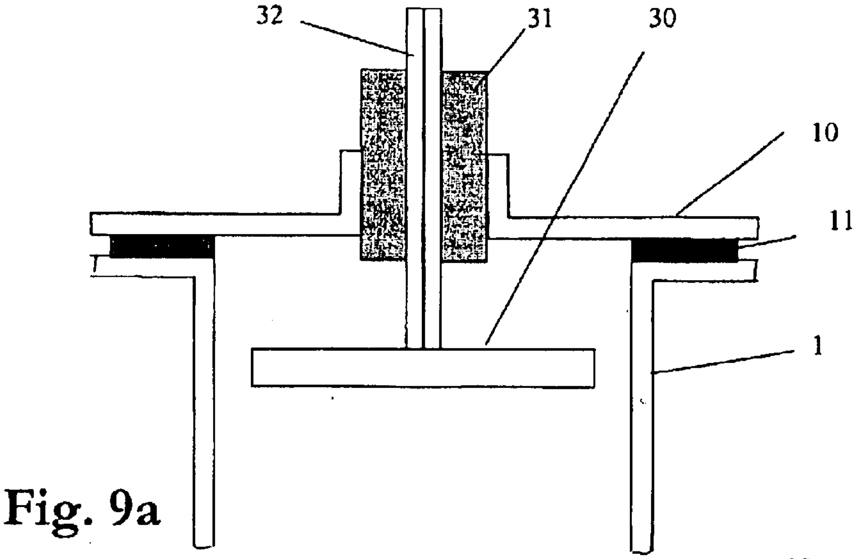
FIG. 9*a* illustrates schematically in a cross-sectional side view a device for waveguide feeding of the modes $H_{11}$, and $H_{01}$ with separate feeding points.
Figure 9B:
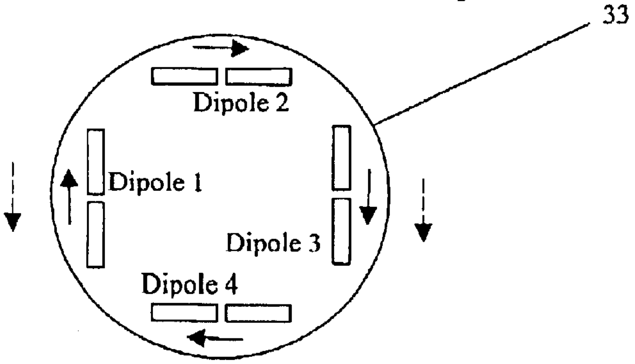
FIG. 9*b* illustrates schematically an antenna device as being comprised in the device of FIG. 8*a*.
Figure 9C:
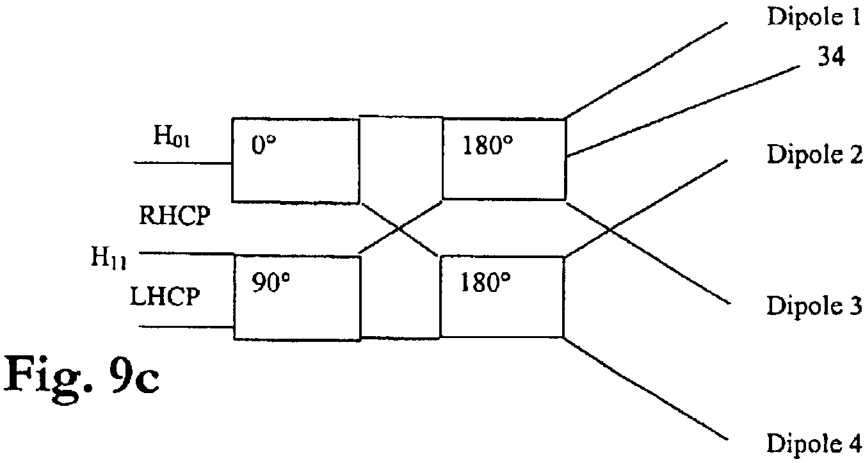
FIG. 9*c* illustrates schematically a coupling network for feeding the antenna device of FIG. 9*b*.

FIGS. 9*a–c* show yet another manner of arranging the waveguide feeding to produce the microwave signal in modes $H_{01}$ and $H_{11}$. An antenna element 30, e.g. in the shape of a printed circuit board, has four dipoles 33, which are fed by four coaxial cables 32 through sealing 31. Outside of the container the four cables are fed via a coupling network, denoted by 34 in FIG. 9*c*, which network is located outside of the container or possibly located on the antenna element 30. The feeding network consists of four standard hybrid circuits 34, which can create three different waveguide modes. The uppermost input gives the $H_{01}$ mode with the four dipoles directed like the solid arrows, see FIG. 9*b*. The other two inputs give the $H_{11}$ mode fed in right hand circular polarization and left hand circular polarization, which are used for transmitting and receiving the H11 mode.

Each of feeding devices as being illustrated in FIGS. 7–9 may comprise a funnel (not illustrated) in the tube 1 to adapt to the diameter of the tube 1. The funnel can be hung down in the tube 1 as mentioned in U.S. Pat. No. 4,641,139, the content of which being hereby incorporated by reference.

In Table 2 below are found attenuations for some preferred combinations of center frequency and tube diameter for the four waveguide modes $H_{11}/E_{01}/H_{01}/H_{02}$. The attenuations over a 25 m tube (i.e. 2×25 m transmission) are given for these four modes in the given order and given in dB separated by slashes.

Note that the figures in Table 2 are only specifying different examples. Any mode may in theory be used as the main mode of propagation. Different modes are given in Eqs. 2 and 3 and in Table 1. However, two of the combinations in Table 2 seem to have particularly preferred properties.

The $H_{02}/E_{01}$ combination in a 100 mm tube using a frequency around 10 GHz is useful as two rotationally symmetric modes are used and as the $H_{02}$ mode (analogous to the more well known $H_{01}$ mode) is fairly independent of the conditions of the tube walls and as $E_{01}$ is far from its cut-off and thus has a propagation similar to conventional radar level gauging through a tube.

The $H_{11}/E_{01}$ combination in a 100 mm tube using a frequency range close to 2.5 GHz (for instance within the ISM-band 2.4–2.5 GHz) is a way of utilizing a lower frequency, which is less sensitive for mechanical details like holes, joints etc. of the tube and which can give a less costly microwave hardware.

Finally it can be seen in the tables below that a use in shorter tubes (many LPG-spheres are just 10–15 m high) will make it possible to use smaller tubes and other modes without having too large attenuation (which is proportional to the tube length).

TABLE 2

Attenuation over 2 × 25 m stainless steel tubes (0.5 Ω/square at 10 GHz) for the four waveguide modes $H_{11}/E_{01}/H_{01}/H_{02}$ for different choices of frequency and tube diameter. NP indicates no propagation (cut-off), NA indicates that none of the modes can propagate, the mode for which the 1.41-condition is fulfilled is underlined, and the most likely preferred two-mode combinations are indicated with one of them underlined to indicate the mode to fulfill the 1.41-condition. The frequencies indicated are just indicative and have to be slight different to fulfill the 1.41-condition.

| Frequency | 2.5 GHz | 5 GHz | 10 GHz |
|---|---|---|---|
| Tube diameter | Attenuation in dB below | Attenuation in dB below | Attenuation in dB below |
| 100 mm | $\underline{7}$/15/NP/NP $\underline{H}_{11}/E_{01}$ | 5/9/$\underline{6}$/NP $\underline{H}_{01}/E_{01}$ | 5/12/2/$\underline{7}$ $\underline{H}_{02}/E_{01}$ |
| 50 mm | NA | $\underline{21}$/41/NP/NP | 13/26/$\underline{18}$/NP $\underline{H}_{01}/H_{11}$ |
| 25 mm | NA | NA | ($\underline{59}$/115/NP/NP) |

In these examples it is assumed that the same frequency is used for both modes, which typically implies a separation, by a switch, separate transmitter or receiver channels etc. Obviously different frequencies can be used making the system more like two separate microwave units (or a widely tunable one) connected to the same tube and with parts of the signal processing in common. In that case a filtering function can be used to separate the signals, and the mode generator can be made to generate different modes for different frequencies.

By means of measuring the microwave signal in two modes of propagation independently of each other, properties of the tube or of the environment in the container may be detected and compensated for. To obtain a good result the modes may be selected such that the microwave signal in one mode is disturbed heavily, whereas the microwave signal in the other mode is disturbed very little.

The signal processing device of unit 4 is preferably adapted to calculate from the propagation time of the transmitted and reflected microwave signal in each mode of propagation the level of the liquid in the container, and to estimate one or more properties of the tube or of the environment in the container based on the calculated levels of the liquid in the container.

Alternatively, the signal processing device of the unit 4 is adapted to calculate attenuations of the distinguished portions of the microwave signal, which are received in different ones of the first and second modes of propagation, and to estimate one or more properties of the tube or of the environment in the container based on the calculated attenuations of the distinguished portions of the microwave signal.

The one or more properties of the tube or of the environment in the container may comprise any of a cross-sectional dimension of the tube, a variation in a cross-sectional dimension along the length of the tube, a concentricity measure of the tube, presence of impurities, particularly solid or liquid hydrocarbons, at the inner walls of the tube, and presence of mist in the gas. Modes with different properties can be used to reveal different parameters.

Figure 10:
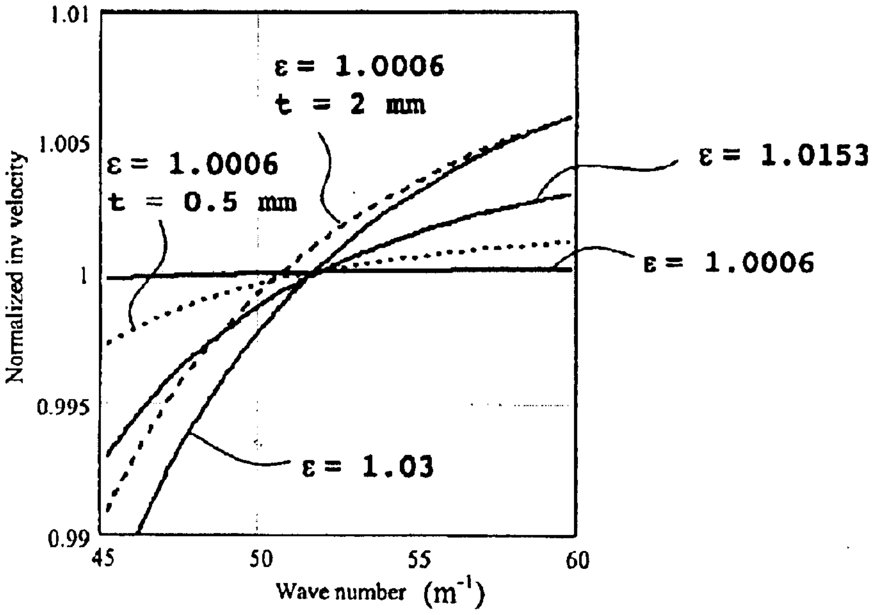
FIGS. 10–12 are schematic diagrams of inverted group velocity normalized to group velocity in vacuum as a function of wave number for the modes $H_{11}$, $E_{01}$, and $H_{01}$, respectively, of microwave radiation in a waveguide filled with gases having different dielectric constants and having dielectric layers of different thicknesses on its inner walls.
Figure 11:
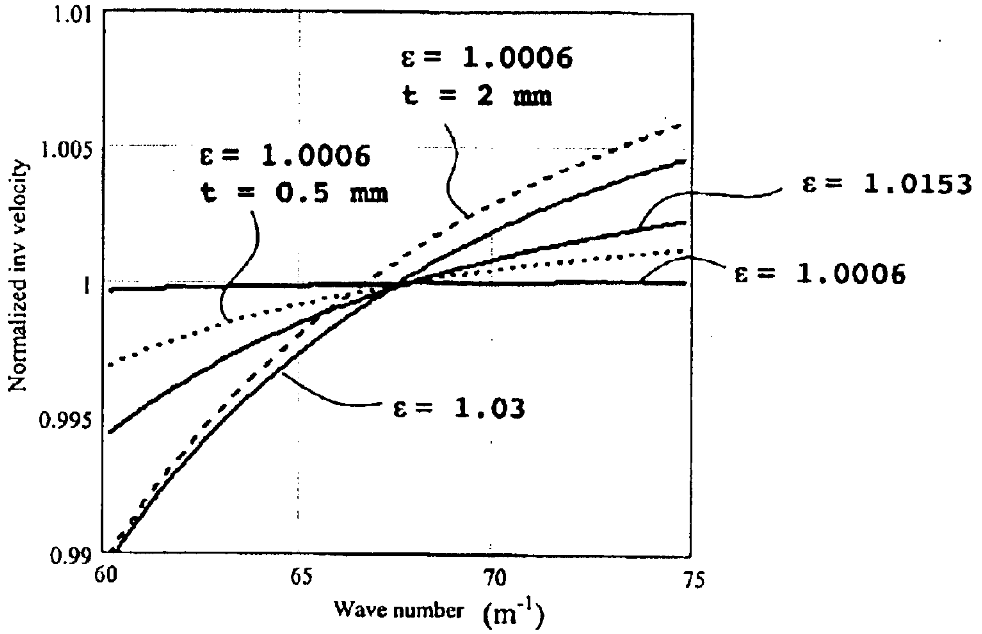
Figure 12:
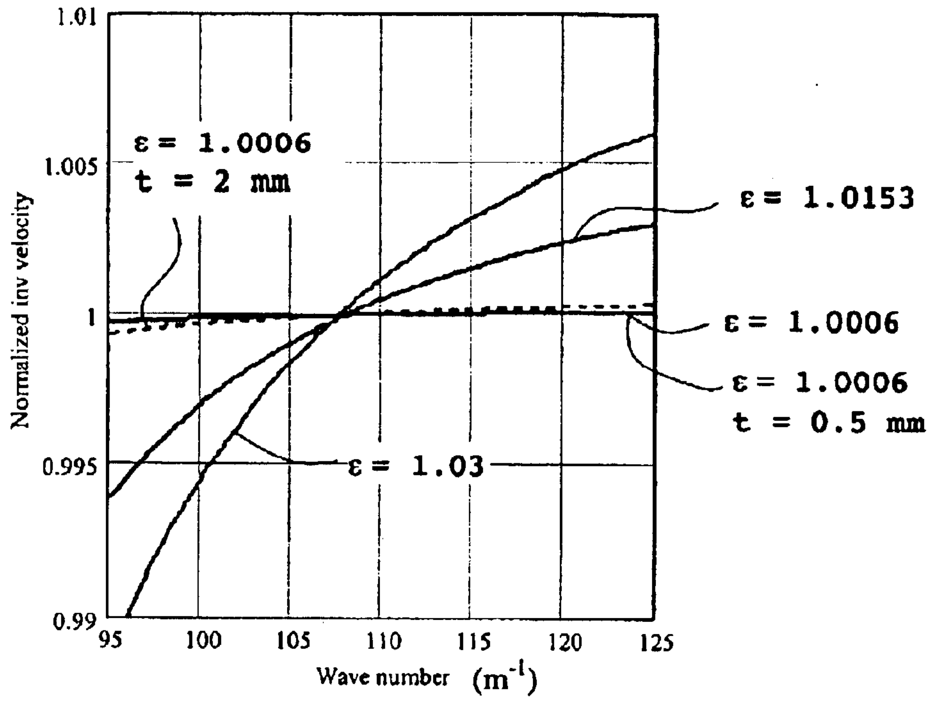

FIGS. 10–12 are schematic diagrams of inverted group velocity normalized to group velocity in vacuum as a function of wave number for the modes $H_{11}$ (FIG. 10), $E_{01}$ (FIG. 11), and $H_{01}$ (FIG. 12), respectively, of microwave radiation in a waveguide filled with gases having different dielectric constants $\epsilon$ and having dielectric layers of different thicknesses t on its inner walls. The dielectric constant of the dielectric layer is set to 2.5, which is a typical value for an oil layer.

Note that the behavior is similar for a gas filling and for a dielectric layer (a gas having $\epsilon$=1.03 gives roughly a similar curve as a 1 mm thick oil layer). For the mode $H_{11}$ a thin dielectric layer behaves very similar to a gas but a thicker layer moves the zero crossing toward lower wave number. For the mode $E_{01}$ the sensitivity for a dielectric layer is slightly larger, whereas for the mode $H_{01}$ a dielectric layer has a very small influence.

Thus, the difference in sensitivity for a dielectric layer gives a possibility to estimate the oil layer (e.g. average thickness or dielectric constant) and possibly to correct for it.

Finally, the reflecting reactance 10 arranged in the tube 1 may be designed to give a substantially stronger reflex of the microwave signal in one of the propagation modes than in the other one of the propagation modes. The reflecting reactance 10 may be realized as a short metallic pin coaxially in the tube 10 supported be a strip of PTFE (being shaped to be non reflective for $H_{11}$). This can be used to get a reference reflection at a mechanically known position for the $E_{01}$ mode, but a very weak reflection for the $H_{11}$ mode.

What is claimed is:

1. An apparatus for high accuracy gauging of the level of a liquid in a container, above which level there exists a gas having a dielectric constant within a predetermined dielectric constant range, comprising:

a transmitter for transmitting a microwave signal in a first mode of propagation in a tube through said gas towards the surface of said liquid, wherein the walls of said tube is provided with a number of holes so that the liquid in said container can flow laterally in and out of said tube to maintain a unitary level of said liquid inside and outside said tube;

a receiver for receiving the microwave signal reflected against the surface of said liquid and propagating back through said tube; and a signal processing device for calculating from the propagation time of the transmitted and reflected microwave signal the level of said liquid in said container, wherein said transmitter is adapted to transmit said microwave signal in a frequency band, at which the group velocity of a microwave signal in said first mode of propagation in said tube is, within said predetermined dielectric constant range, essentially independent of the dielectric constant.

2. The apparatus of claim 1 wherein said transmitter is adapted to transmit said microwave signal in a frequency band, which includes a frequency deviating from an optimum frequency $f_{opt}$ with less than 7%, wherein the optimum frequency is given by $$f_{opt} = f_{c0}\sqrt{\frac{2}{\varepsilon}}$$

where $f_{c0}$ is the cut-off frequency of said first mode of propagation in said tube, and $\epsilon$ is the center dielectric constant of said dielectric constant range.

3. The apparatus of claim 2 wherein said frequency deviates from said optimum frequency $f_{opt}$ with less than 5%.

4. The apparatus of claim 2 wherein said frequency deviates from said optimum frequency $f_{opt}$ with less than 3%.

5. The apparatus of claim 2 wherein said frequency deviates from said optimum frequency $f_{opt}$ with less than 2%.

6. The apparatus of claim 2 wherein said frequency deviates from said optimum frequency $f_{opt}$ with less than 1%.

7. The apparatus of claim 2 wherein said frequency is identical with said optimum frequency $f_{opt}$.

8. The apparatus of claim 1 wherein said frequency band has a center frequency, which deviates from said optimum frequency $f_{opt}$ with less than 7%.

9. The apparatus of claim 8 wherein said center frequency deviates from said optimum frequency $f_{opt}$ with less than 5%.

10. The apparatus of claim 8 wherein said center frequency deviates from said optimum frequency $f_{opt}$ with less than 3%.

11. The apparatus of claim 8 wherein said center frequency deviates from said optimum frequency $f_{opt}$ with less than 2%.

12. The apparatus of claim 8 wherein said center frequency deviates from said optimum frequency $f_{opt}$ with less than 1%.

13. The apparatus of claim 1 wherein said predetermined dielectric constant range is about 1–1.03.

14. The apparatus of claim 1 wherein said liquid is comprised of a condensed gas and said gas is comprised of said condensed gas in gaseous phase, which condensed gas being stored in said container at overpressure.

15. The apparatus of claim 1 wherein the tube comprises a waveguide.

16. The apparatus of claim 1 wherein said tube has a rectangular cross section.

17. The apparatus of claim 1 wherein said tube has a circular cross section.

18. The apparatus of claim 17 wherein the first mode of propagation, in which said transmitter transmits said microwave signal in said waveguide, is any of $H_{11}$, $H_{01}$, and $H_{02}$.

19. The apparatus of claim 18 wherein said tube has a diameter of about 100 mm and said transmitter is adapted to transmit said microwave signal in any of $H_{11}$ mode at about 2.5 GHz, $H_{01}$ mode at about 5 GHz, and $H_{02}$ mode at about 10 GHz.

20. The apparatus of claim 18 wherein said tube has a diameter of about 50 mm and said transmitter is adapted to transmit said microwave signal in $H_{01}$ mode at about 10 GHz.

21. The apparatus of claim 1 wherein said transmitter transmits said microwave signal in a second mode of propagation in said tube through said gas towards the surface of said liquid; and said receiver receives said microwave signal reflected against the surface of said liquid and propagating back through said tube in said second mode of propagation; and to distinguish portions of said microwave signal received in different ones of said first and second modes of propagation.

22. The apparatus of claim 21 wherein said tube has a circular cross section and said second mode of propagation is any of $E_{01}$ or $H_{11}$.

23. The apparatus of claim 21 wherein said receiver distinguishes portions of said microwave signal received in different ones of said first and second modes of propagation based on the portions different arrival times at said receiver.

24. The apparatus of claim 23 wherein said transmitter transmits said microwave signal in said first and second modes of propagation sequentially.

25. The apparatus of claim 21 wherein said transmitter transmits said microwave signal in said first and second modes of propagation spectrally separated.

26. The apparatus of claim 21 wherein said signal processing device calculates the dielectric constant of said gas above the level of said liquid based on said received and distinguished portions of said microwave signal received in different ones of said first and second modes of propagation.

27. The apparatus of claim 21 wherein said signal processing device calculates a cross section dimension of said tube based on said received and distinguished portions of said microwave signal received in different ones of said first and second modes of propagation.

28. The apparatus of claim 27 wherein said tube has a circular cross section and said cross section dimension calculated is the average diameter of said tube along the distance said microwave signal propagates before being reflected against the surface of said liquid.

29. The apparatus of claim 21 wherein said signal processing device calculates from the propagation time of the transmitted and reflected microwave signal in said second mode of propagation the level of said liquid in said container; and said signal processing device estimates one or more properties of the tube or of the environment in said container based on said calculated levels of said liquid in said container.

30. The apparatus of claim 21 wherein said signal processing device calculates attenuations of said distinguished portions of said microwave signal, which are received in different ones of said first and second modes of propagation; and said signal processing device estimates one or more properties of the tube or of the environment in said container based on said calculated attenuations of said distinguished portions of said microwave signal.

31. The apparatus of claim 29 wherein said one or more properties of the tube or of the environment in said container comprises a cross-sectional dimension of said tube, a variation in a cross-sectional dimension along the length of said tube, a concentricity measure of said tube, presence of impurities, particularly solid or liquid hydrocarbons, at the inner walls of said tube, or presence of mist in said gas.

32. The apparatus of claim 29 wherein a reflecting reactance is arranged in said tube to give a substantially stronger reflex of the microwave signal in one of the propagation modes than in the other one of the propagation modes.

33. The apparatus of claim 1 wherein said microwave signal is a frequency modulated continuous wave signal.

34. The apparatus of claim 1 wherein said microwave signal is a pulsed radar signal.

35. The apparatus of claim 1 wherein said transmitter is adapted to transmit said microwave signal in a frequency band, which is adjustable.

36. A method for high accuracy gauging of the level of a liquid in a container, above which level there exists a gas having a dielectric constant within a predetermined dielectric constant range, and in which container there is arranged a tube provided with a number of lateral holes so that the liquid in said container can flow laterally in and out of said tube to maintain a unitary level of the liquid inside and outside said tube, comprising the steps of:

determining a first quantity representative of an inner dimension of said tube;

determining based on said first quantity a frequency band, at which the group velocity of a microwave signal in a first mode of propagation in said tube is, within said predetermined dielectric constant range, essentially independent of the dielectric constant;

tuning a transmitter to opera:e in said frequency band;

transmitting in said frequency band a microwave signal in said first mode of propagation in said tube through said gas towards the surface of said liquid;

receiving in said frequency band the microwave signal reflected against the surface of said liquid and propagating back through said tube;

determining a second quantity representative of a propagation time of the transmitted and reflected microwave signal; and calculating based on said first and second quantities the level of said liquid in said container.

37. The method of claim 36 wherein said frequency band includes a frequency deviating from an optimum frequency $f_{opt}$ with less than 7%, wherein the optimum frequency is calculated as $$f_{opt} = f_{c0}\sqrt{\frac{2}{\varepsilon}}$$

where $f_{c0}$ is the cut-off frequency of said first mode of propagation in said tube, and $\epsilon$ is the center dielectric constant of said dielectric constant range.

38. The method of claim 37 wherein said frequency deviates from said optimum frequency $f_{opt}$ with less than 7%.

39. The method of claim 37 wherein said frequency deviates from said optimum frequency $f_{opt}$ with less than 5%.

40. The method of claim 37 wherein said frequency deviates from said optimum frequency $f_{opt}$ with less than 3%.

41. The method of claim 37 wherein said frequency deviates from said optimum frequency $f_{opt}$ with less than 2%.

42. The method of claim 37 wherein said frequency deviates from said optimum frequency $f_{opt}$ with less than 1%.

43. The method of claim 37 wherein said frequency is identical with said optimum frequency $f_{opt}$.

44. The method of claim 36 wherein said frequency band has a center frequency, which deviates from said optimum frequency $f_{opt}$ with less than 7%.

45. The method of claim 44 wherein said center frequency deviates from said optimum frequency $f_{opt}$ with less than 5%.

46. The method of claim 44 wherein said center frequency deviates from said optimum frequency $f_{opt}$ with less than 3%.

47. The method of claim 44 wherein said center frequency deviates from said optimum frequency $f_{opt}$ with less than 2%.

48. The method of claim 44 wherein said center frequency deviates from said optimum frequency $f_{opt}$ with less than 1%.

49. The method of claim 34 wherein said predetermined dielectric constant range is about 1–1.03.

50. The method of claim 36 wherein said liquid is comprised of a condensed gas and said gas is comprised of said condensed gas in gaseous phase, which condensed gas being stored in said container at overpressure.

51. The method of claim 36 wherein the first mode of propagation, in which said transmitter transmits said microwave signal in said waveguide, is any of $H_{11}$, $H_{01}$, and $H_{02}$.

52. The method of claim 36 wherein said microwave signal is transmitted in a second mode of propagation in said waveguide through said gas towards the surface of said liquid;

said microwave signal reflected against the surface of said liquid and propagating back through said waveguide in said second mode of propagation is received; and portions of said microwave signal received in different ones of said first and second modes of propagation are distinguished.

53. An apparatus for gauging the level of a liquid in a container, above which level a gas exists, comprising:

a transmitter for transmitting a microwave signal in a waveguide through said gas towards the surface of said liquid;

a receiver for receiving the microwave signal reflected against the surface of said liquid and propagating back through said waveguide; and a signal processing device for calculating from the propagation time of the transmitted and reflected microwave signal the level of said liquid in said container, wherein said transmitter transmits said microwave signal in at least two different modes of propagation and within a frequency band, which admits propagation of said microwave signal in said at least two different modes in said waveguide; and said receiver receives said microwave signal in said at least two different modes of propagation and to distinguish portions of said microwave signal received in different ones of said at least two different modes of propagation.

54. The apparatus of claim 53 wherein said signal processing device calculates from the propagation time of the transmitted and reflected microwave signal in each mode of propagation the level of said liquid in said container; and said signal processing device estimates one or more properties of the waveguide or of the environment in said container based on said calculated levels of said liquid in said container, and to use said estimate of said one or more properties to calculate a corrected level of said liquid in said container.

55. The apparatus of claim 53 wherein said signal processing device calculates attenuations of said distinguished portions of said microwave signal, which are received in different ones of said at least two different modes of propagation; and said signal processing device estimates one or more properties of the waveguide or of the environment in said container based on said calculated attenuations of said distinguished portions of said microwave signal, and to use said estimate of said one or more properties to calculate a corrected level of said liquid in said container.

56. The apparatus of claim 54 wherein said one or more properties of the waveguide or of the environment in said container comprises a cross-sectional dimension of said waveguide, a variation in a cross-sectional dimension along the length of said waveguide, a concentricity measure of said waveguide, presence of impurities, particularly solid or liquid hydrocarbons, at the inner wails of said waveguide, or presence of mist in said gas.

57. The apparatus of claim 53 wherein a reflecting reactance is arranged in said waveguide to give a substantially stronger reflex of the microwave signal in one of said at least two different modes of propagation than in an other one of said at least two different modes of propagation.

58. A method for gauging the level of a liquid in a container, above which level a gas exists, comprising the steps of:

transmitting a microwave signal in a waveguide through said gas towards the surface of said liquid;

receiving the microwave signal reflected against the surface of said liquid and propagating back through said waveguide; and calculating from the propagation time of the transmitted and reflected microwave signal the level of said liquid in said container, wherein:

said microwave signal is transmitted in at least two different modes of propagation and within a frequency band, which admits propagation of said microwave signal in said at least two different modes in said waveguide;

said microwave signal is received in said at least two different modes of propagation; and portions of said microwave signal received in different ones of said at least two different modes of propagation are distinguished.

59. An apparatus for gauging the level of a liquid in a container, above which level there exists a gas or gas mixture having a dielectric constant within a dielectric constant range, comprising:

a transmitter for transmitting a microwave signal in a mode of propagation in a waveguide through said gas towards the surface of said liquid;

a receiver for receiving the microwave signal reflected against the surface of said liquid and propagating back through said waveguide; and a signal processing device for calculating from the propagation time of the transmitted and reflected microwave signal the level of said liquid in said container, wherein said transmitter transmits said microwave signal in a frequency band, whose center frequency is essentially equal to, or close to, an optimum frequency $f_{opt}$ wherein the optimum frequency is calculated as $$f_{opt} = f_{c0}\sqrt{\frac{2}{\varepsilon}}$$

where $f_{c0}$ is the cut-off frequency of said mode of propagation in said waveguide, and $\epsilon$ is the center dielectric constant of said dielectric constant range.

60. The apparatus of claim 59 wherein said dielectric constant range is about 1–1.03.

61. The apparatus of claim 60 wherein said liquid is comprised of a condensed gas and said gas is comprised of said condensed gas in gaseous phase, which condensed gas being stored in said container at overpressure.

62. An apparatus for gauging the level of a liquid in a container, above which level there exists a gas or gas mixture, comprising:

a transmitter for transmitting a microwave signal in a mode of propagation in a waveguide through said gas towards the surface of said liquid;

a receiver for receiving the microwave signal reflected against the surface of said liquid and propagating back through said waveguide; and a signal processing device for calculating from the propagation time of the transmitted and reflected microwave signal the level of said liquid in said container, wherein said transmitter transmits said microwave signal at a frequency where the group velocity of said microwave signal in said mode of propagation as a function of the dielectric constant of said gas has a local maximum.

63. The apparatus of claim 62 wherein said liquid is comprised of a condensed gas and said gas is comprised of said condensed gas in gaseous phase, which condensed gas being stored in said container at overpressure.

64. An apparatus for gauging the level of a liquid in a container, above which level there exists a gas or gas mixture, comprising:

a transmitter for transmitting a microwave signal in a waveguide through said gas towards the surface of said liquid;

a receiver for receiving the microwave signal reflected against the surface of said liquid and propagating back through said waveguide; and a signal processing device for calculating from the propagation time of the transmitted and reflected microwave signal the level of said liquid in said container, wherein said transmitter transmits said microwave signal at a frequency where the microwave signal can propagate in said gas in said waveguide only in $H_{11}$ and $E_{01}$ modes.

65. The apparatus of claim 64 wherein said liquid is comprised of a condensed gas and said gas is comprised of said condensed gas in gaseous phase, which condensed gas being stored in said container at overpressure.

66. A method for gauging the level of a liquid in a container, above which level there exists a gas or gas mixture, comprising the steps of:

transmitting a microwave signal in a mode of propagation in a waveguide through said gas towards the surface of said liquid;

receiving the microwave signal reflected against the surface of said liquid and propagating back through said waveguide; and calculating from the propagation time of the transmitted and reflected microwave signal the level of said liquid in said container, wherein the frequency and mode of propagation of said microwave signal, and the cross sectional dimension of said waveguide are selected with respect to each other to obtain a group velocity of the microwave signal in the waveguide, which is fairly constant over an predetermined range of dielectric constant values.

67. The apparatus of claim 66 wherein said predetermined range of dielectric constant values is about 1–1.03.

68. The apparatus of claim 66 wherein said predetermined range of dielectric constant values is a subset of about 1–1.03.

69. The apparatus of claim 66 wherein said liquid is comprised of a condensed gas and said gas is comprised of said condensed gas in gaseous phase, which condensed gas being stored in said container at overpressure.

70. An apparatus for gauging the level of a liquid in a container, above which level there exists a gas or gas mixture having a dielectric constant within a dielectric constant range, comprising:

a transmitter for transmitting a microwave signal in a first mode of propagation in a waveguide through said gas towards the surface of said liquid;

a receiver for receiving the microwave signal reflected against the surface of said liquid and propagating back through said waveguide; and a signal processing device for calculating from the propagation time of the transmitted and reflected microwave signal the level of said liquid in said container, wherein said transmitter transmits said microwave signal in a frequency band, which includes a frequency deviating from an optimum frequency $f_{opt}$ with less than 7%, wherein the optimum frequency is calculated as $$f_{opt} = f_{c0}\sqrt{\frac{2}{\varepsilon}}$$

where $f_{c0}$ is the cut-off frequency of said first mode of propagation in said waveguide, and $\epsilon$ is the center dielectric constant of said dielectric constant range.

71. A method for gauging the level of a liquid in a container, above which level there exists a gas or gas mixture having a dielectric constant within a dielectric constant range, comprising the steps of:

transmitting a microwave signal in a first mode of propagation in a waveguide through said gas towards the surface of said liquid;

receiving the microwave signal reflected against the surface of said liquid and propagating back through said waveguide; and calculating from the propagation time of the transmitted and reflected microwave signal the level of said liquid in said container, wherein:

said microwave signal is transmitted in a frequency band, which includes a frequency deviating from an optimum frequency $f_{opt}$ with less than 7%, wherein the optimum frequency is calculated as $$f_{opt} = f_{c0}\sqrt{\frac{2}{\varepsilon}}$$

where $f_{c0}$ is the cut-off frequency of said first mode of propagation in said waveguide, and $\epsilon$ is the center dielectric constant of said dielectric constant range.

* * * * *